United States Patent
Ishiskawa et al.

(10) Patent No.: US 6,492,041 B2
(45) Date of Patent: *Dec. 10, 2002

(54) ORGANIC ELECTROLUMINESCENT DEVICE HAVING HIGH EFFICIENT LUMINANCE

(75) Inventors: Hitoshi Ishiskawa, Tokyo (JP); Satoru Toguchi, Tokyo (JP); Atsushi Oda, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/220,622

(22) Filed: Dec. 24, 1998

(65) Prior Publication Data

US 2002/0064679 A1 May 30, 2002

(30) Foreign Application Priority Data

Dec. 25, 1997 (JP) .............................. 9-357023

(51) Int. Cl.⁷ .............................................. H05B 33/12
(52) U.S. Cl. ........................ 428/690; 428/917; 313/504; 313/506
(58) Field of Search ................................ 428/690, 704, 428/917; 313/504, 506

(56) References Cited

U.S. PATENT DOCUMENTS

| | | | |
|---|---|---|---|
| 5,443,922 A | * 8/1995 | Nishizaki et al. | 428/690 |
| 5,989,737 A | * 11/1999 | Xie et al. | 428/690 |
| 6,150,042 A | * 11/2000 | Tamano et al. | 428/690 |

FOREIGN PATENT DOCUMENTS

| | | | |
|---|---|---|---|
| EP | 0 847 228 A2 | * | 6/1998 |
| JP | 5-32966 | * | 2/1993 |
| JP | 6-136360 | * | 5/1994 |
| JP | 7-138561 | | 5/1995 |
| JP | 8-20771 | | 1/1996 |
| JP | 8-40995 | | 2/1996 |
| JP | 8-40997 | | 2/1996 |
| JP | 10-302960 | | 11/1998 |

OTHER PUBLICATIONS

Bacher et al., "Triphenylenes: a new class of hole transport material in organic light emitting diodes", Organic Light–Emitting Materials and Devices, Zakya H. Kafafi, Editor, Proceedings of SPIE vol. 3148, pp. 313–320, Jul. 30–Aug. 1, 1997.*

* cited by examiner

Primary Examiner—Marie Yamnitzky
(74) Attorney, Agent, or Firm—Katten, Muchin, Zavis Rosenman

(57) ABSTRACT

An organic EL device includes in a luminescent layer, hole transport layer or an electron transport layer, a triphenylene compound defied by the following formula:

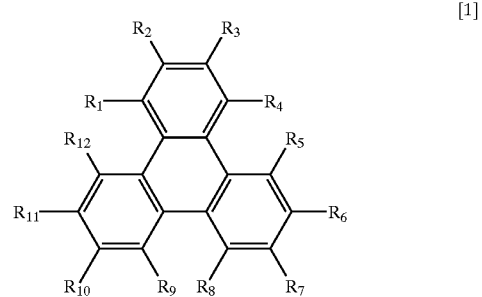

[1]

Wherein each of $R_1$ to $R_{12}$ represents hydrogen, halogen, hydroxyl group, amino group, nitro group, alkyl group etc.

7 Claims, 2 Drawing Sheets

ORGANIC ELECTROLUMINESCENT DEVICE HAVING HIGH EFFICIENT LUMINANCE

BACKGROUND OF THE INVENTION (a) Field of the Invention

The present invention relates to an organic electroluminescent (EL) device having an excellent luminescence property such as high efficient luminance (b) Description of the Related Art An organic electroluminescent device (which will hereinafter be called "organic EL device") is a light-emitting device which makes use of the principle that when an electric is field is applied, a fluorescent material emits light in response to the charge recombination of holes injected from an anode and electrons injected from a cathode. After C. W. Tang et al. of Eastman Kodak Company reported a low-voltage-driven organic EL device using a double layered structure (C. W. Tang, S. A. Vanslyke, Applied Physics Letters, 51,913(1987) and the like), studies on an organic EL device have been briskly carried out. Tang et al. reported an organic EL device using tris(8-hydroxyquinolinol aluminum) in a light-emitting layer and a triphenyldiamine derivative to a hole-transporting layer. This stacked structure gives such advantages as an improvement in the injection efficiency of holes into the light-emitting layer; blocking of electrons injected from a cathode, which increase the efficiency of exciton production from charge recombination; and confinement of the excitons into the light-emitting layer. A double layered structure composed of a hole-injecting and transporting layer and an electron-transporting and light-emitting layer or a triple layered structure composed of a hole-injecting and transporting layer, a light-emitting layer and an electron-injecting and transporting layer is well known as an organic EL device. In order to increase the recombination efficiency of injected holes and electrons, various improvements in the device structure or fabrication process have been introduced to such multi-layered devices. As a hole-transporting material, triphenylamine derivatives such as 4,4',4"-tris(3-methylphenylphenylamino) triphenylamine and aromatic diamine derivatives such as N,N'-diphenyl-N,N'-bis(3-methylphenyl)-[1,1'-biphenyl]-4,4'-diamine, which are starburst molecules, are well known (e.g., Japanese Patent Application Laid-Open Nos. 20771/1996, 40995/1996, 40997/1996, 543397/1996. and 87122/1996).

As an electron-transporting material, oxadiazole derivatives, triazole derivatives and the like are well known.

As a light-emitting material, known are chelate complexes such as tris(8-quinolinolate)aluminum complex, coumarin derivatives, tetraphenylbutadiene derivatives, bis-styrylarylene derivatives, oxadiazole derivatives and the like. Since various color light in a visible region from blue to red are obtained from these light-emitting materials, there increased expectation for industrialization of a full color organic EL device (e.g., Japanese Patent Application Laid-Open Nos. 239655/1996, 138561/1995, 200289/1991 and the like).

In recent days, organic EL devices with high brightness and long lifetime have been disclosed or reported, but any of then are not enough in these properties.

SUMMARY OF THE INVENTION

It is therefore an object of the present invention to provide materials for the organic EL devices having high luminance or long-term operating life.

The inventors found that specific organic compounds having a triphenylene frame exhibit excellent properties for high-luminance electroluminescence, and thus are suitable for the materials for the organic EL devices In addition, among other organic compounds having the triphenylene frame, the compounds having a diarylamino group as a substituent group, wherein the aryl group has a styryl group as a substituent group, provided excellent organic EL devices exhibiting an especially high luminance.

In accordance with the above findings, the present invention provides organic EL devices defined as follows:

(a) Organic EL device having one or more than one organic thin-film layers disposed between an anode and a cathode, and at least one of the organic thin-film layers including, in the form of a mixture or a single substance, the trphenylene compound expressed general formula [1] as follows:

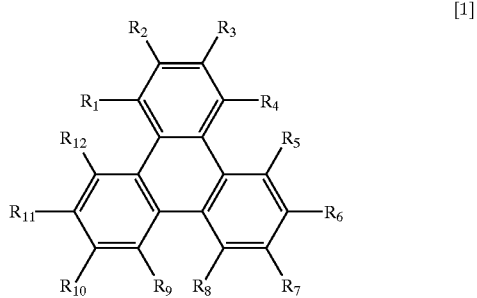

[1]

wherein each of $R_1$ to $R_{12}$ independently represents hydrogen atom, halogen atom, hydroxyl group, substituted or non-substituted amino group, nitro group, cyano group, substituted or non-substituted alkyl group, substituted or non-substituted or non-substituted alkenyl group, substituted or non-substituted cycloalkyl group, substituted or non-substituted alkoxy group, substituted or non-substituted aromatic hydrocarbon, substituted or non-substituted aromatic heterocyclic group, substituted or non-substituted aralkyl group, substituted or non-substituted aryloxy group, substituted or non-substituted alkoxycarbonyl group, or carboxyl group, and wherein each of $R_1$ to $R_{12}$ may be a ring formed by two of the atoms or groups as mentioned herein;

(b) Organic EL device defined in (a), wherein the triphenylene compound defined by formula [1] (simply referred to as triphenylene compound [1], hereinafter) is such that at least one of $R_1$ to $R_{12}$ is a diarylamino group expressed by —$NAr_1Ar_2$, each of given $Ar_1$ and $Ar_2$ independently representing aryl group having 6–20 carbons, at least one of $Ar_1$ and $Ar_2$ having a substituted or non-substituted styryl group as a substituent group;

(c) Organic EL device defined in (a), wherein the organic thin-film layer includes a hole transport layer having the triphenylene compound [1] in the form of a mixture or a single substance;

(d) Organic EL device defined in (a), wherein the organic thin-film layer includes at least a hole transport layer having the triphenylene compound defined [1] in a mixture or a single substance, and wherein at least one of $R_1$ to $R_{12}$ is a diarylamino group expressed by —$NAr_1Ar_2$, each of given $Ar_1$ and $Ar_2$ independently representing aryl group having 6–20 carbons, at least one of $Ar_1$ and $Ar_2$ having a substituted or non-substituted styryl group as a substituent group;

(e) Organic EL device defined in (a), wherein the organic thin-film layer includes at least an electron transport layer including the triphenylene compound [1] in the form of a mixture or a single substance;

(f) Organic EL device defined in (a), wherein the organic thin-film layer includes at least an electron transport layer having the triphenylene compound [1] in the form of a mixture or a single substance, and wherein the triphenylene compound [1] is such that at least one of $R_1$ to $R_{12}$ is a diarylamino group expressed by —$NAr_1Ar_2$, each of given $Ar_1$ and $Ar_2$ independently representing an aryl group having 6–20 carbons, at least one of $Ar_1$ and $Ar_2$ having a substituted or non-substituted styryl group as a substituent group;

(g) Organic EL device having a organic luminescent zone disposed between an anode and a cathode, wherein the organic luminescent zone includes, adjacent to said anode, one or more than one organic thin-film layers, at least one of said one or more than one organic luminescent layers including a compound expressed in a general formula [1]; and (h) Organic EL device defined in (g), wherein the triphenylene compound defined by formula [1] (simply referred to as triphenylene compound [1], hereinafter) is such that at least one of R1 to R12 is a diarylamino group expressed by —NAr1Ar2, each of given Ar1 and Ar2 independently representing aryl group having 6–20 carbons, at least one of Ar1 and Ar2 having a substituted or non-substituted styryl group as a substituent group.

The EL device according to the present invention exhibits a high luminance and a long-term operating life compared to the conventional EL device.

The above and other objects, features and advantages of the present invention will be more apparent from the following description, referring to the accompanying drawings.

PREFERRED EMBODIMENTS OF THE INVENTION

Figure 1:
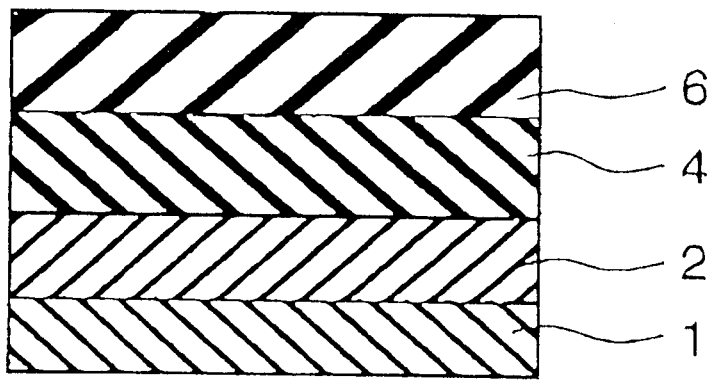
FIG. 1 is a sectional view of a first example of the organic EL device according to the present invention.

Now, the present invention is more specifically described. The triphenylene compound used in the present invention has the structure shown by general formula [1].

Examples of the halogen atoms used as $R_1$ to $R_{12}$ in the formula [1] include fluorine, chlorine, bromine, and iodine.

The substituted or non-substituted amino group is expressed by —$NX_1X_2$, wherein each of $X_1$ and $X_2$ independently represents hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl,group, 2-nitroisobutyl group, 1,2-dinitroethyl group, 1,3-dinirtroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl) phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 2-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-hurazanyl group, 2 thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl1-indolyl group, 4-t-butyl1-indolyl group, 2-t-butyl3-indolyl group, and 4-t-butyl3-indolyl group.

Examples of the substituted or non-substituted alkyl group includes methyl group, ethyl group, propyl group, isopropyl group, n-butyl, s-butyl, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-hydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-chloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl, group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoehtyl group, 1,3-dicyanoisopropy group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or non-substituted alkenyl group include vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group.

Examples of the substituted or non-substituted cycloalkyl group include cyclopropyl group, cyclobutyl group, cyclopentyl group, cyclohexyl group, and 4-methylcyclohexyl group.

Examples of the substituted or non-substituted alkoxy group include groups represented by —OY wherein Y may be methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-chloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodo isopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3 -dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or non-substituted aromatic hydrocarbon group include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthril group, 4'-methylbiphenylyl group and 4"-t-butyl-p-terphenyl-4-yl group.

Examples of the substituted or non-substituted aromatic heterocyclic group include 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl, group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7phenanthroline-8-yl group, 1,7-phenanthroline-9-yl group, 1,7-phenanthroline-1-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole 4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl1-indolyl group, 4-t-butyl1-indolyl group, 2-t-butyl3-indolyl group and 4-t-butyl3-indolyl group.

Examples of the substituted or non-substituted aralkyl group include benzyl group, 1-phenylethyl group, 2-phenylethyl group, 1-phenylisopropyl group, 2-phenylisopropyl group, phenyl-t-butyl group, α-naphthylmethyl group, 1-α-naphthylmethyl group, 2-α-naphthylmethyl group, 1-α-naphthylisopropyl group, 2-α-naphthylisopropyl group, β-naphthylmethyl group, 1-β-naphthylethyl group, 2-β-naphthylmethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

The substituted or non-substituted aryloxy group is represented by —OZ, wherein Z may be phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline- 3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group) 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 2,7-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-mehyl-3-indolyl group, 4-methyl-3-indolyl group, 2-t-butyl1-indolyl group, 4-t-butyl1-indolyl group, 2-t-butyl3-indolyl group and 4-t-butyl3-indolyl group.

The substituted or non-substituted alkoxycarbonyl group is represented by —COOY, wherein Y may be methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the dihydrolic group forming a ring include tetramethylene group, pentamethylene group, hexamethylene group, diphenylmethane-2,2'-diyl group, diphenylethane-3,3'-diyl group, and diphenylpropane-4,4'-diyl group.

Examples of the aryl group having 6–20 carbon atoms, defined in (b), (d), (f) and (h), include phenyl group, naphthyl group, anthryl group, phenanthryl group, naphthacenyl group, and pyrenyl group. Examples of the substituent group for substituting the aryl group include halogen atom, hydroxyl group, the substituted or non-substituted amino group as mentioned before, nitro group, cyano group, the substituted or non-substituted alkyl group as mentioned before, the substituted or non-substituted alkenyl group as mentioned before, the substituted or non-substituted cycloalkyl group as mentioned before, the substituted or non-substituted alkoxy group as mentioned before, substituted or non-substituted aromatic hydrocarbon group as mentioned before, the substituted or non-substituted aromatic heterocyclic group as mentioned before, substituted or non-substituted aralkyl group as mentioned before, the substituted or non-substituted aryloxy group as mentioned before, the substituted or non-substituted alkoxycarbonyl group as mentioned before, and carboxyl group.

Examples of the styryl group which $Ar_1$ or $Ar_2$ has as a substituent group include non-substituted styryl group and 2,2-diphenylvinyl group as well as substituted styryl group and 2,2-diphenylvinyl group having halogen atoms, hydroxyl group, the substituted or non-substituted amino group as mentioned before, nitro group, cyano group, the substituted or non-substituted alkyl group as mentioned before, the substituted or non-substituted alkenyl group as mentioned before, the substituted or non-substituted cycloalkyl group as mentioned before, the substituted or non-substituted alkoxy group as mentioned before, substituted or non-substituted aromatic hydrocarbon group as mentioned before, the substituted or non-substituted aromatic heterocyclic group as mentioned before, substituted or non-substituted aralkyl group as mentioned before, the substituted or non-substituted aryloxy group as mentioned before, the substituted or non-substituted alkoxycarbonyl group as mentioned before, and carboxyl group, in the form of a substituent group for substituting the last phenyl group.

Triphenylene compound [1] in the present invention can be synthesized using a known method. For example, a tryiphenylene compound having diphenylamino group can be prepared by using known Ullmann reaction between triphenylene compound having amino group and an aromatic halogen compound or a triphenylene compound having halogen and aromatic mine compound In addition, a styryl derivative can be prepared by using known Wittig-Horner reaction.

Examples of the triphenylene compound [1] include, although not limited to, the following compounds (1) to (18):

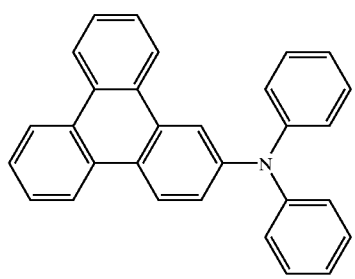
(1)
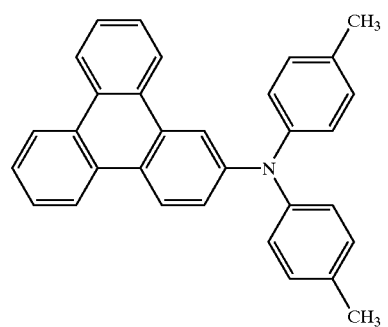
(2)
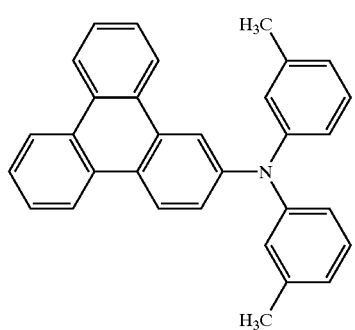
(3)
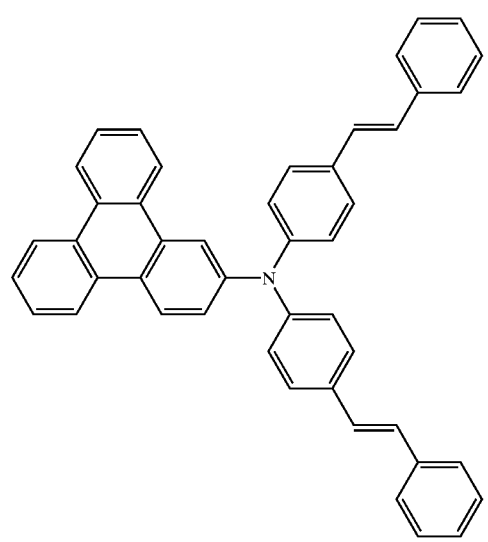
(4)
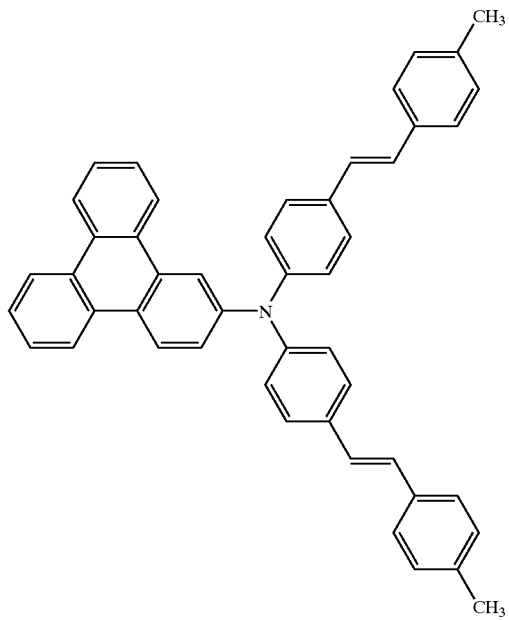
(5)

(6)
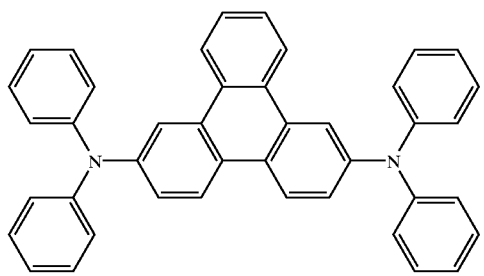
(7)
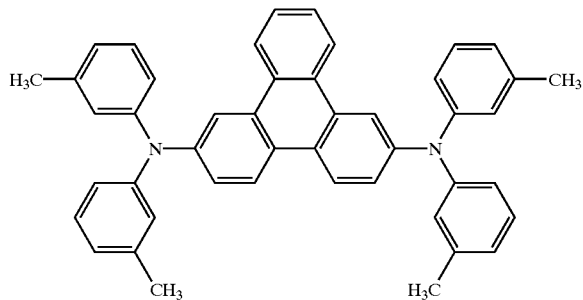
(8)
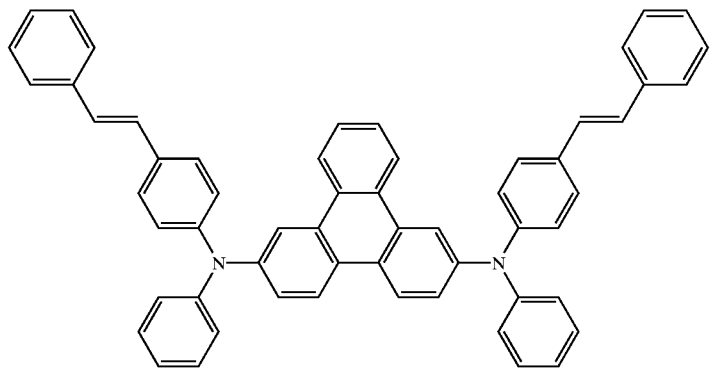
(9)
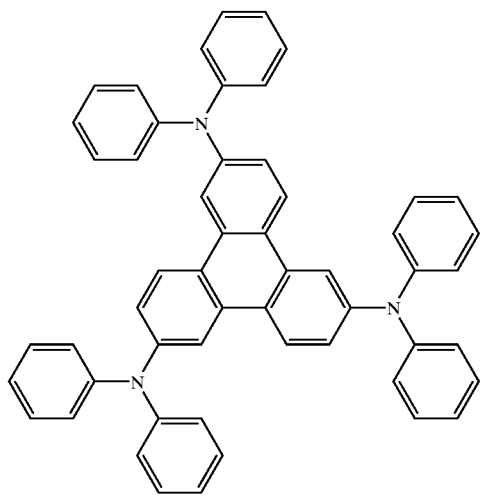
(10)
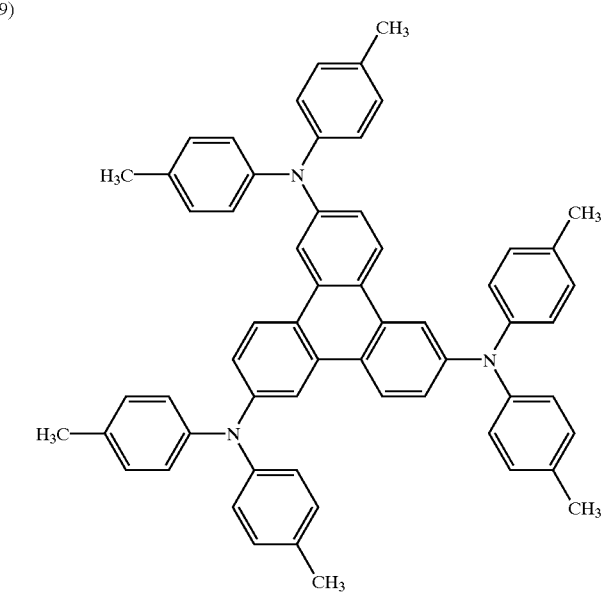

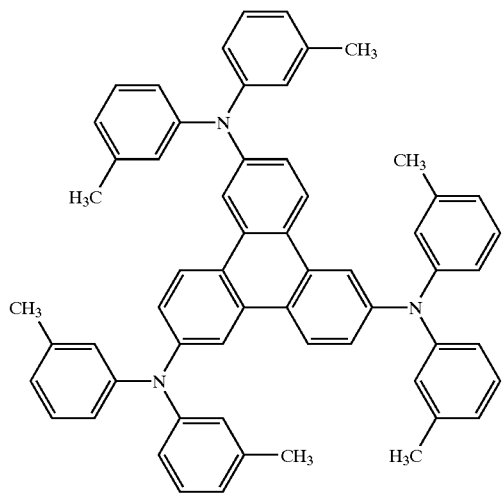
(11)
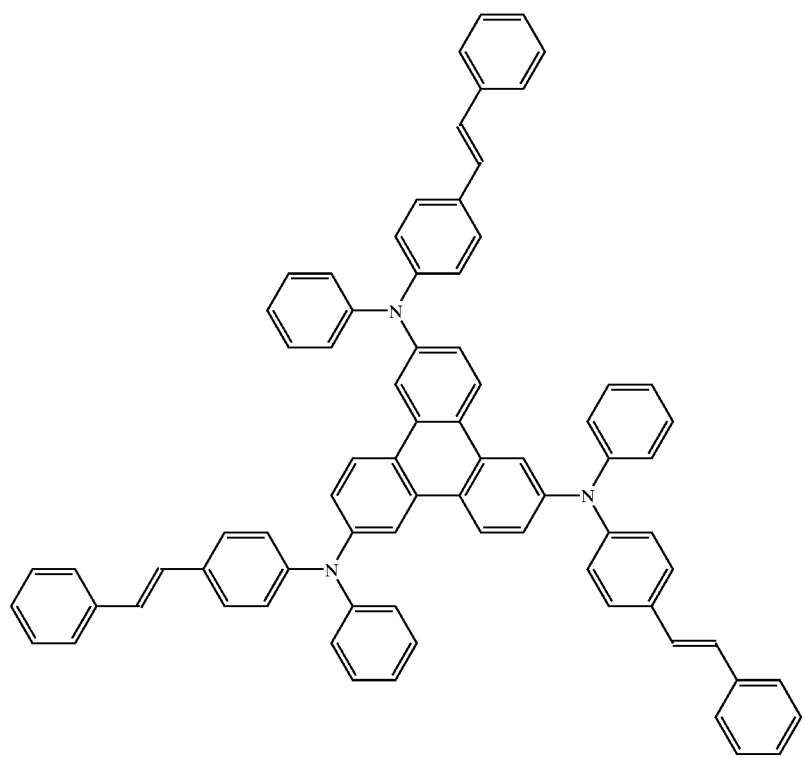
(12)

-continued
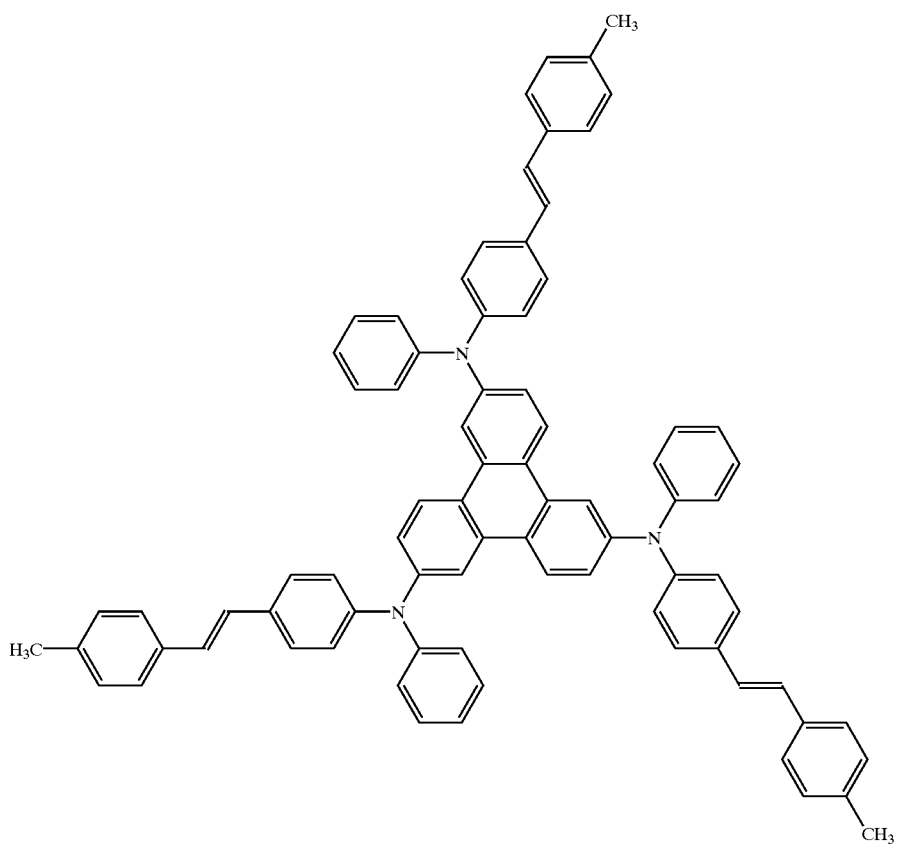
(13)
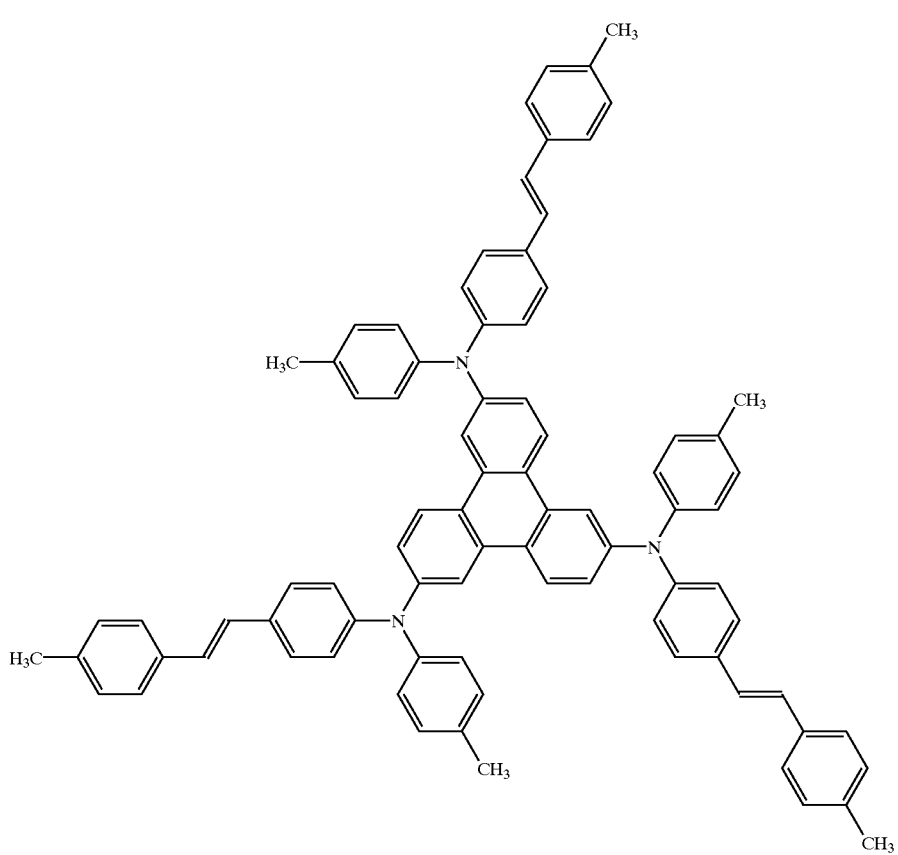
(14)

-continued
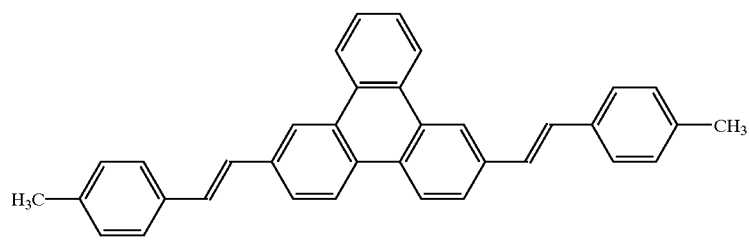
(15)
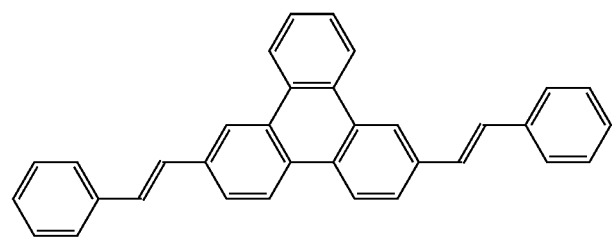
(16)
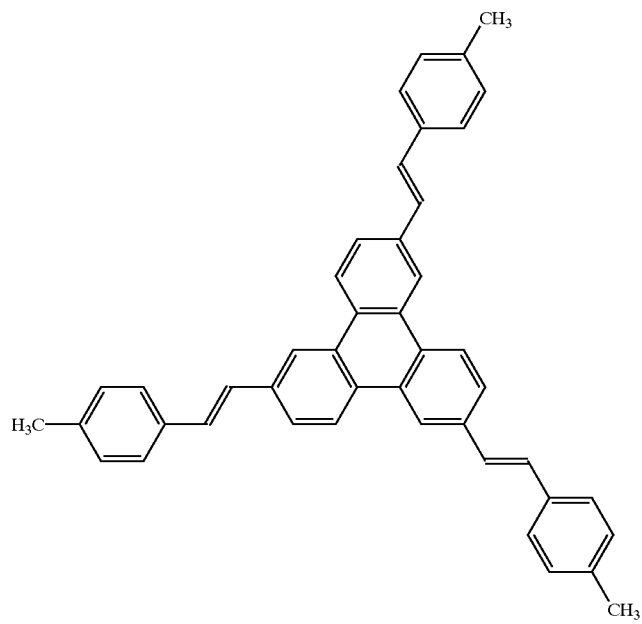
(17)
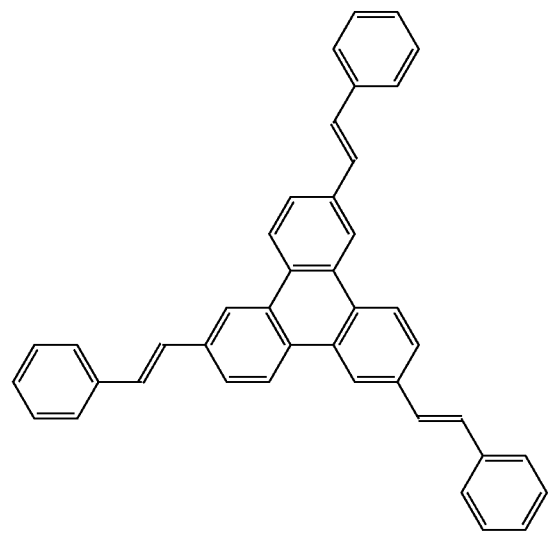
(18)

The organic EL device according to an embodiment of the present embodiment includes one or more than one organic layers between electrodes. The structures of the EL device are exemplarily shown in FIGS. 1 to 4. The EL device shown in FIG. 1 includes an anode 2, a luminescent layer 4 and a cathode 6 consecutively formed on a substrate 1. The EL device shown in FIG. 2 includes an anode 2, a hole transport layer 3, a luminescent layer 4, an electron transport layer 5 and a cathode 6 consecutively formed on a substrate 1. The EL device shown in FIG. 3 includes an anode 2, a hole transport layer 3, luminescent layer 4 and a cathode 6 consecutively formed on a substrate 1. The EL device shown in FIG. 4 includes an anode 2, a luminescent layer 4, an electron transport layer 5 and a cathode 6 consecutively formed on a substrate 1. The triphenylene compound [1] may be used in any of the organic layers shown in FIGS. 1 to 4, and may be introduced by doping in other materials including a hole transport material, a luminescent material and an electron transport material.

Any material generally used as a conventional hole transport material can be used for the hole transport layer in the EL device of the present invention. Examples of such materials include, but not limited to, triphenyldiamine such as bis(di(p-tolyl)aminophenyl-1,1-cyclohexane [01], N,N'-diphenyl-N,N'-bis(3-methylphenyl)-1,1'-biphenyl-4,4'-diamine [02], and N,N'-diphenyl-N-N-bis(1-naphthyl)-1,1'-biphenyl-4,4'-diamine [03], and starburst molecules such as compounds [04], [05] and [06], shown below:

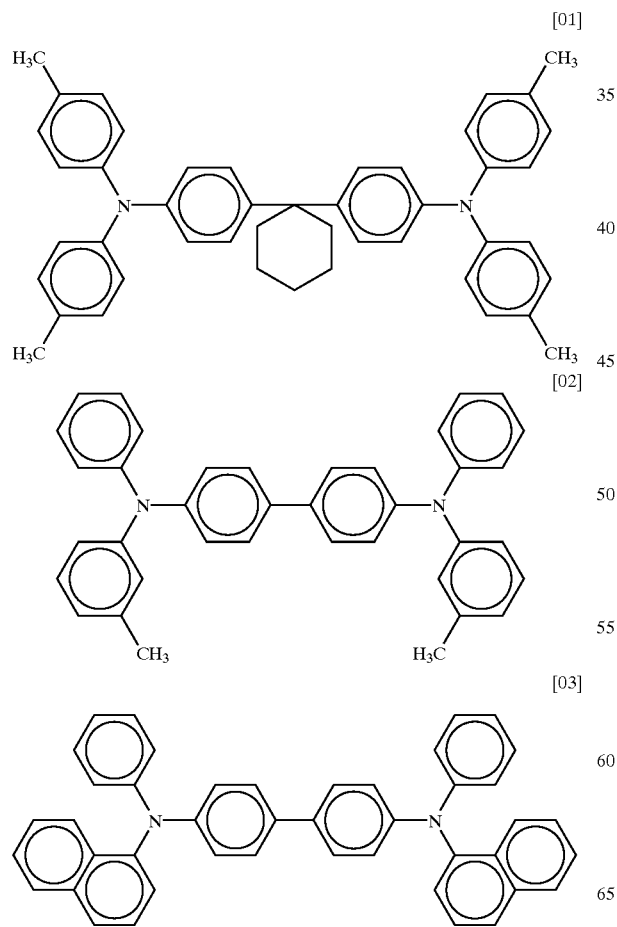

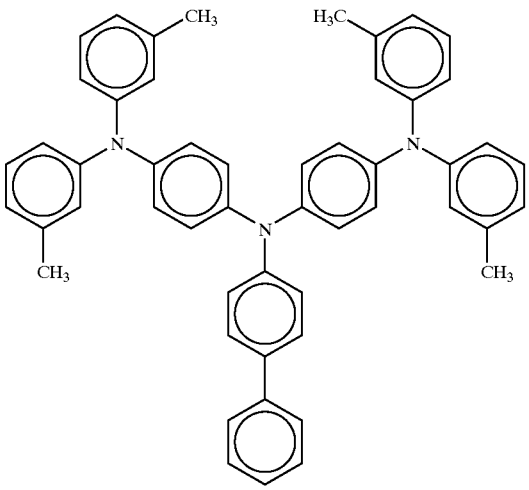

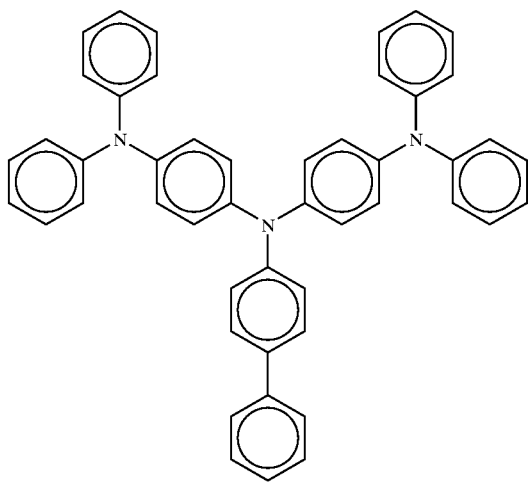

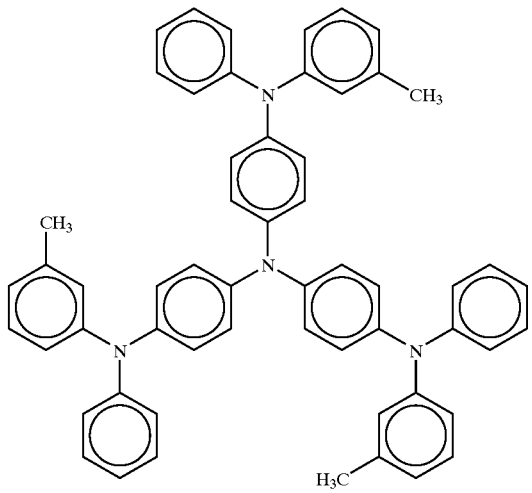

Any material generally used as a conventional electron transport material can be used for the electron transport layer in the EL device of the present invention. Examples of such materials include, but not limited to, oxadiazole derivatives such as 2-(4-biphenylyl)-5-(4-t-butylphenyl)-1,3,4- oxadiazole [07], and bis {2-(4-t-butylphenyl)-1,3,4-oxadiazole}-m-phenylene [08], triazole derivatives such as compounds [09] and [10], quinolinol metal complex such as compounds [11] to [14], as shown below:

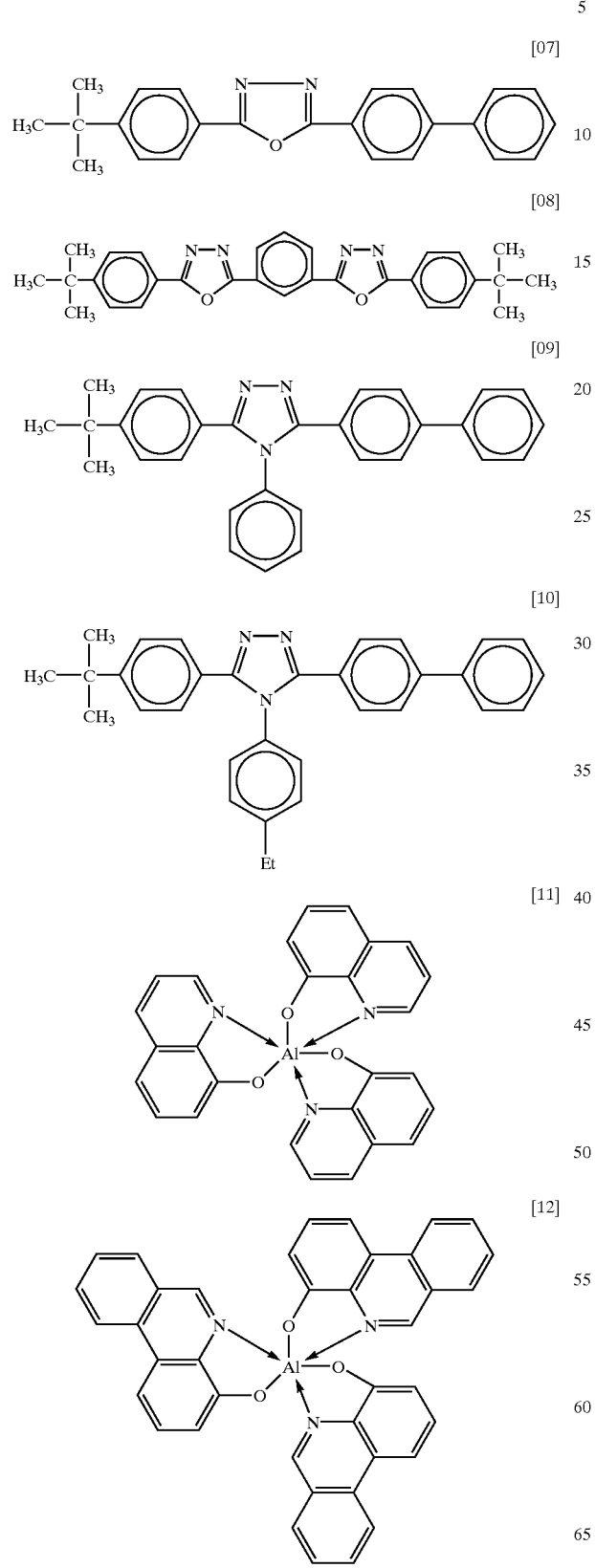

-continued

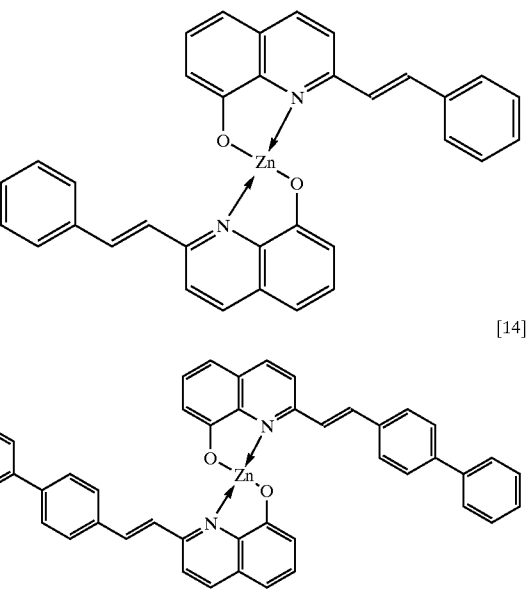

The anode of the organic thin-film EL device has a function for injecting positive holes into the hole transport layer and preferably has a work function equal to or above 4.5 eV. Examples of materials for the anode include indium tin oxide (ITO), tin oxide (NESA), gold, silver, platinum and copper. The cathode of the organic thin-film EL device has a function for injecting electrons into the electron transport layer or the luminescent layer and preferably has a smaller work function. Examples for the material for the cathode include indium, aluminum, magnesium, magnesium-indium alloy, magnesium-aluminum alloy, aluminum-lithium alloy, aluminum-scandium-lithium alloy, and magnesium-silver alloy.

Processes, such as vacuum evaporation or spin-coating, generally used for fabricating a conventional EL device can be used for the organic EL device of the present invention. Examples of such processes for forming the organic thin-film layer including the triphenylene compounds [1] include, but not limited to, vacuum evaporation, molecular beam epitaxy (MBE), and dipping, spin-coating, casting, bar-coating or roll-coating of solutions wherein these materials are dissolved into solvents.

The organic layers in the organic EL device of the present invention may have any thickness. However, a preferable thickness generally resides between several nanometers and 1 micrometer. A smaller thickness tends to have a defect such as a as pin-hole, whereas a larger thickness tends to require a high excitation voltage and may have a poor efficiency Now, practical examples of the organic EL device, to which the present invention is not limited, will be described. The first example relates to an exemplified process for the synthesis of one of the triphenylene compounds [1], although other triphenylene compounds [1] were prepared in the following Examples by using conventional methods.

Synthesis

Triphenylene and N-bromosuccinimide were introduced to mixture (4:1) of water and sulfuric acid and stirred for five hours at 60° C. The object compound was extracted from the reacted solution using toluene and neutralized with 5% sodium hydrogencarbonate solution. After drying the compound by using magnesium sulfate, coarse crystals of the compound, left after evaporation of the solvent, were recrystallized from the toluene-hexane mixed solvent, to prepare 2-bromotriphenylene compound. Thereafter, the 2-bromotriphenylene compound, diphenylamine, potassium carbonate and copper powder were introduced in a three-necked flask, and stirred for 30 hours at 200° C. The reaction product was subjected to extraction using toluene and to washing using water. Then, the product was subjected to drying using magnesium sulfate, evaporation of the solvent, and separation refinement by silica gel column chromatography using a 1:2 mixture of toluene and hexane to obtain 2-diphenylaminotriphenylene.

The following examples of the organic EL device of the present invention include Examples 1 to 7 having an luminescent layer including the triphenylene compound [1], Examples 8 to 10 having a luminescent layer including the triphenylene compound [1] and a hole transport material, Examples 11 and 12 having a luminescent layer including the triphenylene compound [1] and an electron transport layer, Examples 13 and 14 having a hole transport layer including the triphenylene compound [1], Example 15 having an electron transport layer including the triphenylene compound [1], and Examples 16 and 17 having a hole transporting luminescent layer including the triphenylene compound [1].

EXAMPLE 1

Example 1 had a structure shown in FIG. 1. The EL device had a structure of anode 2/luminescent layer 4/cathode 6. An ITO film was sputtered onto a glass substrate to form an anode 2 having a sheet resistance of 20 Ω/□. Thereafter, a luminescent layer 4 having the compound (1) was formed by vacuum evaporation to a thickness of 40 nm (nanometers). Thereafter, a cathode 6 having a magnesium-silver alloy was formed thereon to a thickness of 200 nm, thereby achieving an organic EL device. The EL device thus fabricated exhibited a luminescence of 1000 cd/m$^2$ at an applied DC voltage of 5 volts.

EXAMPLE 2

Examples 2 was fabricated similarly to Example 1 except for the compound (2) used in the present example. The EL device thus obtained exhibited a luminance of 1000 cd/m$^2$ at an applied DC voltage of 5 volts.

EXAMPLE 3

An ITO film was sputtered onto a glass substrate to form an anode 2 having a sheet resistance of 20 Ω/□. Thereafter, a luminescent layer 4 having the compound (1) was formed by spin-coating using a chloroform solution to a thickness of 40 nm. Thereafter, a cathode 6 having a magnesium-silver alloy was formed thereon by vacuum evaporation to a thickness of 200 nm, thereby achieving an organic EL device. The EL device thus fabricated exhibited a luminescence of 1200 cd/m$^2$ at an applied DC voltage of 5 volts.

EXAMPLE 4

Figure 2:
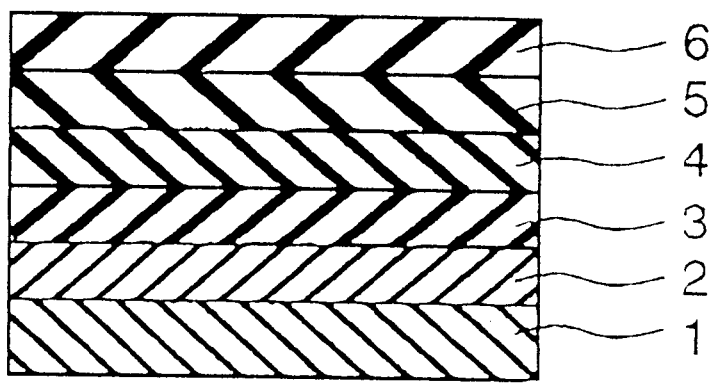
FIG. 2 is a sectional view of a second example of the Organic EL device according to the present invention.

Example 4 had a layer structure of anode 2/hole transport layer 3/luminescent layer 4/cathode 6, as shown in FIG. 2. An ITO film was sputtered onto a glass substrate to form an anode 2 having a sheet resistance of 20 Ω/□. Thereafter, a hole transport layer 3 having N,N'-diphenyl-N,N '-bis(3-methylphenyl)-[1,1'-biphenyl]-4,4'-diamine defined in [02] was formed using a vacuum evaporation to a thickness of 45 nm. Thereafter, a luminescent layer 4 having the compound defined in formula (9) was formed by vacuum evaporation. Subsequently, an electron transport layer 5 having 2-(4-biphenylyl)-5-(4-t-butylphenyl)-1,3,4-oxadiazole defined in formula [07] was formed by vacuum evaporation. Further, a cathode 6 having a magnesium-silver alloy was formed thereon by vacuum evaporation to a thickness of 200 nm, thereby achieving an organic EL device. The EL device thus fabricated exhibited a luminescence of 5500 cd/m$^2$ at an applied DC voltage of 10 volts.

EXAMPLE 5

Figure 4:
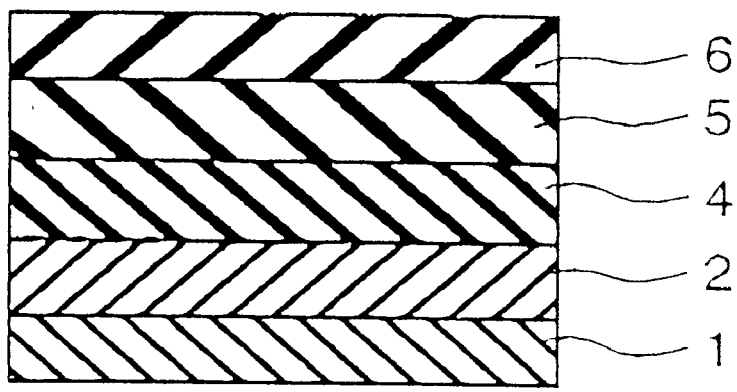
FIG. 4 is a sectional view of a fourth example of the organic EL device according to the present invention.

Example 5 was fabricated similarly to FIG. 4 except for the hole transport layer 3 which had N,N'-diphenyl-N-N-bis (1-naphthyl)-1,1'-biphenyl-4,4'-diamine [03], and the electron transport layer 5 which had bis{2-(4-t-butylphenyl)-1, 3,4-oxadiazole}-m-phenylene [08] in the present example. The EL device thus fabricated exhibited 6000 cd/m$^2$ at an applied DC voltage of 10 volts.

EXAMPLE 6

Example 6 was fabricated similarly to Example 4 except for the hole transport layer 3 which had the compound [04 ], the luminescent layer which had the compound (10), and the electron transport layer 5 which had the compound [11] in the present example. The EL device thus obtained exhibited a luminance of 6800 cd/m$^2$ at an applied DC voltage of 10 volts.

EXAMPLE 7

Example 7 was fabricated similarly to Example 4 except for the hole transport layer 3 which had the compound [05], the luminescent layer 4 which had the compound (11) and the electron transport layer 5 which had the compound [12] in the present example. The EL device thus obtained exhibited a luminance of 7000 cd/m$^2$ at an applied DC voltage of 10 volts.

EXAMPLE 8

Example 8 had a layer structure of anode 2/luminescent layer 4/electron transport layer 5/cathode 6, as shown in FIG. 4. An ITO film was sputtered onto a glass substrate 1 to form an anode 2 having a sheet resistance of 20 Ω/□. Thereafter, a luminescent layer 4 having N,N'-diphenyl-N-N-bis(1-naphthyl)-1,1'-biphenyl-4,4'diamine [03] and the compound (9) were formed by vacuum evaporation at a weight ratio of 1:10 to a thickness of 50 nm. Subsequently, an electron transport layer 5 having the compound [09] was formed by vacuum evaporation to a thickness of 50 nm. Further, a cathode 6 having a magnesium-silver alloy was formed thereon by vacuum evaporation to a thickness of 200 nm, thereby achieving an organic EL device. The EL device thus fabricated exhibited a luminescence of 5200 cd/m$^2$ at an applied DC voltage of 10 volts

EXAMPLE 9

Example 9 was fabricated similarly to Example 8 except for compound (17) used instead of compound (9) in the present example. The EL device thus obtained exhibited a luminance of 5300 cd/m$^2$ at an applied DC voltage of 10 volts.

EXAMPLE 10

An ITO film was sputtered onto a glass substrate 1 to form an anode 2 having a sheet resistance of 20 Ω/□. Thereafter, a chloroform solution having the compound (12) and N,N'-diphenyl-N-N-bis(1-naphthyl)-1,1'-biphenyl-4,4'-diamine [03] at a molar ratio of 1:10 was spin-coated to from a luminescent layer 4 having a thickness of 40 nm. Thereafter, an electron transport layer 5 having the compound [10] was formed by vacuum evaporation to a thickness of 50 nm. Subsequently, a cathode 6 having a magnesium-silver alloy was formed thereon by vacuum evaporation to a thickness of 200 nm, thereby achieving an organic EL device. The EL device thus fabricated exhibited a luminescence of 4300 cd/m$^2$ at an applied DC voltage of 10 volts.

EXAMPLE 11

Figure 3:
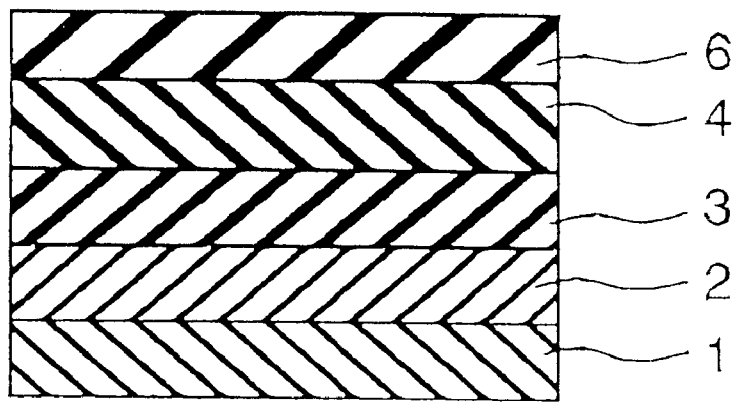
FIG. 3 is a sectional view of a third example of the organic EL device according to the present invention.

Example 11 had a layer structure of anode 2/transport layer 3/lumiescent layer 4/cathode 6, as shown in FIG. 3. An ITO film was sputtered onto a glass substrate 1 to form an anode 2 having a sheet resistance of 20 Ω/□. Thereafter, a hole transport layer 3 having N,N'-diphenyl-N-N-bis(1-naphthyl)-1,1'-biphenyl-4,4'-diamine [03] was formed by vacuum evaporation to a thickness of 50 nm. Subsequently, a luminescent layer 4 having the compounds [11] and (14) at a weight ratio of 20:1 was formed by vacuum co-evaporation to a thickness of 50 nm. Subsequently, a cathode 6 having a magnesium-silver alloy was formed thereon to a thickness of 200 nm, thereby achieving an organic EL device. The EL device thus fabricated exhibited a luminescence of 4500 cd/m$^2$ at an applied DC voltage of 10 volts.

EXAMPLE 12

Example 12 was fabricated similarly to Example 11 except for the hole transport layer 3 having N,N'-diphenyl-N,N'-bis(3-methylphenyl)-[1,1'-biphenyl]-4,4'-diamine [02] and the luminescent layer 4 having the compounds [13] and (13) at a weight ratio of 20:1 in the present embodiment. The EL device thus obtained exhibited a luminance of 3700 cd/m$^2$ at an applied DC voltage of 10 volts.

EXAMPLE 13

Example 13 was fabricated similarly to Example 11 except for the hole transport layer 3 having the compound (18) and the luminescent layer 4 having the compounds [13] in the present embodiment. The EL device thus obtained exhibited a luminance of 4000 cd/m$^2$ at an applied DC voltage of 10 volts.

EXAMPLE 14

Example 14 was fabricated similarly to Example 11 except for the hole transport layer 3 having the compounds (11) in the present example. The EL device thus obtained exhibited a luminance of 4500 cd/m$^2$ at an applied DC voltage of 10 volts.

EXAMPLE 15

Example 15 was fabricated similarly to Example 4 except for the hole transport layer 3 having N,N'-diphenyl-N-N-bis(1-naphthyl)-1,1'-biphenyl)-4,4'-diamine [03], the luminescent layer 4 having the compound [13] and the electron transport layer having the compound (13) in the present example. The EL device thus obtained exhibited a luminance of 2500 cd/m$^2$ at an applied DC voltage of 10 volts.

EXAMPLE 16

Example 16 had a layer structure of anode 2/luminescent layer 4/electron transport layer 5/cathode 6, as shown in FIG. 4. An ITO film was sputtered onto a glass substrate 1 to form an anode 2 having a sheet resistance of 20 Ω/□. Thereafter, a luminescent layer 4 having the compound (14) was formed by vacuum evaporation to a thickness of 40 nm. Subsequently, an electron transport layer 5 having 2-(4-biphenylyl)-5-(4-t-butylphenyl)-1,3,4-oxadiazole defined in formula [07] was formed by vacuum evaporation to a thickness of 20 nm. Subsequently, a cathode 6 having a magnesium-silver alloy was formed thereon to a thickness of 200 nm, thereby achieving an organic EL device. The EL device thus fabricated exhibited a luminescence of 1500 cd/m$^2$ at an applied DC voltage of 10 volts.

EXAMPLE 17

Example 17 was fabricated similarly to Example 16 except for the electron transport layer having the compound [02] in the present example. The EL device thus obtained exhibited a luminance of 2000 cd/m2 at an applied DC voltage of 10 volts.

Examples 1 to 17 as described above were excited at an initial luminance of 100 cd/m$^2$ for effecting a continued excitation. All examples had a half-luminescence operating life as high as 500 hours or above after the continued excitation.

As described above, the EL device according to the present invention exhibits a high luminance and a long operating time compared to the conventional EL device.

Since the above embodiments are described only for examples, the present invention is not limited to the above embodiments and various modifications or alterations can be easily made therefrom by those skilled in the art without departing from the scope of the present invention.

What is claimed is:

1. An organic electro luminescent (EL) device comprising an anode, a cathode and at least one organic thin-film layer disposed between said anode and said cathode, said one or more than one organic thin-film layers including a luminescent layer, said one or at least one of said more than one organic thin-film layers including a compound expressed in a general formula (1) as follows:

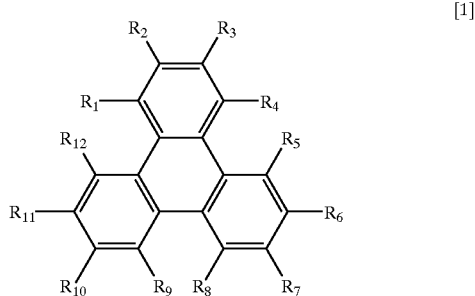

[1]

wherein each of $R_1$ to $R_{12}$ independently represents a hydrogen atom, halogen atom, hydroxy group, substituted or non-substituted amino group, nitro group, cyano group, substituted or non-substituted alkyl group, substituted or non-substituted alkenyl group, substituted or non-substituted cycloalkyl group, substituted or non-substituted alkoxy group, substituted or non-substituted aromatic hydrocarbon, substituted or non-substituted aromatic heterocyclic group, substituted or not substituted aralkyl group, substituted or non-substituted aryloxy group, substituted or non-substituted alkoxycarbonyl group, or carboxyl group, and wherein each of $R_1$ to $R_{12}$ may be a ring formed by two of said atoms and groups and at least one of $R_1$ to $R_{12}$ is a diarylamino group expressed by —$NAr_1Ar_2$, each of $Ar_1$ and $Ar_2$ independently representing an aryl group having 6–20 carbons, one of $Ar_1$ and $Ar_2$ having a substituted or non-substituted styryl group as a substituent group and the other of the $Ar_1$ and $Ar_2$ having no substituted or non-substituted styryl group as a substituent group.

2. The EL device as defined in claim 1, wherein said organic thin-film layer comprises a hole transport layer having the triphenylene compound defined by formula (1).

3. An organic electro luminescent (EL) device comprising an anode, a cathode and at least one organic thin-film layer disposed between said anode and said cathode, said one or more than one organic thin-film layers including a luminescent layer, said one or at least one of said more than one organic thin-film layers including a compound expressed in a general formula (1) as follows:

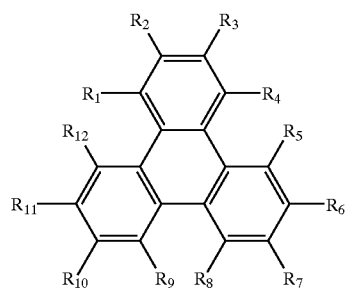

[1]

wherein each of $R_1$ to $R_{12}$ independently represents a hydrogen atom, halogen atom, hydroxy group, substituted or non-substituted amino group, nitro group, cyano group, substituted or non-substituted alkyl group, substituted or non-substituted alkenyl group, substituted or non-substituted cycloalkyl group, substituted or non-substituted alkoxy group, substituted or non-substituted aromatic hydrocarbon, substituted or non-substituted aromatic heterocyclic group, substituted or not substituted aralkyl group, substituted or non-substituted aryloxy group, substituted or non-substituted alkoxycarbonyl group, or carboxyl group, and wherein each of $R_1$ to $R_{12}$ may be a ring formed by two of said atoms and groups and at least one of $R_1$ to $R_{12}$ is a diarylamino group expressed by —$NAr_1Ar_2$, each of $Ar_1$ and $Ar_2$ independently representing an aryl group having 6–20 carbons, at least one of $Ar_1$ and $Ar_2$ having a substituted or non-substituted styryl group as a substituent group, wherein said organic thin-film layer comprises an electron transport layer having the triphenylene compound defined by formula (1).

4. An organic EL device comprising in sequence an anode, organic luminescent zone and a cathode, said organic luminescent zone including, adjacent to said anode, at least one organic thin-film layer, one or more of said at least one organic thin-film layer including a triphenylene compound having at least one substituent that is a diarylamino group expressed by —$NAr_1Ar_2$ attached directly to one of the triphenylene rings, each of $Ar_1$ and $Ar_2$ independently representing an aryl group having 6–20 carbons, one of $Ar_1$ and $Ar_2$ having a substituted or non-substituted styryl group as a substituent group and the other of the $Ar_1$ and $Ar_2$ having no substituted or non-substituted styryl group as a substituent group.

5. An organic electro luminescent (EL) device comprising an anode, a cathode and at least one organic thin-film layer disposed between said anode and said cathode, said one or more than one organic thin-film layers including a luminescent layer, said one or at least one of said more than one organic thin-film layers including a compound expressed in a general formula (1) as follows:

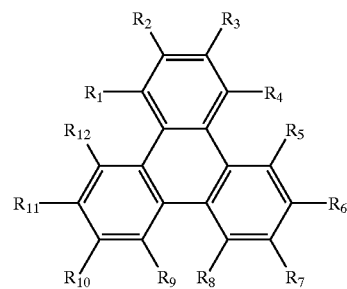

[1]

wherein each of $R_1$ to $R_{12}$ independently represents a hydrogen atom, halogen atom, hydroxy group, substituted or non-substituted amino group, nitro group, cyano group, substituted or non-substituted alkyl group, substituted or non-substituted alkenyl group, substituted or non-substituted cycloalkyl group, substituted or non-substituted alkoxy group, substituted or non-substituted aromatic hydrocarbon, substituted or non-substituted aromatic heterocyclic group, substituted or not substituted aralkyl group, substituted or non-substituted aryloxy group, substituted or non-substituted alkoxycarbonyl group, or carboxyl group, and wherein each of $R_1$ to $R_{12}$ may be a ring formed by two of said atoms and groups and at least one of $R_1$ to $R_{12}$ is a diarylamino group expressed by —$NAr_1Ar_2$, each of $Ar_1$ and $Ar_2$ independently representing an aryl group having 6–20 carbons, at least one of $Ar_1$ and $Ar_2$ having a substituted or non-substituted styryl group as a substitutent group, said compound being in said luminescent layer.

6. An organic EL device comprising in sequence an anode, organic luminescent zone and a cathode, said organic luminescent zone including, adjacent to said anode, at least one organic thin-film layer, one or more of said at least one organic thin-film layer including a triphenylene compound having at least one substituent that is a diarylamino group expressed by —$NAr_1Ar_2$ attached directly to one of the triphenylene rings, each of $Ar_1$ and $Ar_2$ independently representing an aryl group having 6–20 carbons, at least one of $Ar_1$ and $Ar_2$ having a substituted or non-substituted styryl group as a substituent group, said triphenylene compound being in a luminescent layer contained within said organic luminescent zone.

7. An organic EL device comprising in sequence an anode, organic luminescent zone and a cathode, said organic luminescent zone including, adjacent to said anode, at least one organic thin-film layer, one or more of said at least one organic thin-film layer including a triphenylene compound having at least one substituent that is a diarylamino group expressed by —$NAr_1Ar_2$ attached directly to one of the triphenylene rings, each of $Ar_1$ and $Ar_2$ independently representing an aryl group having 6–20 carbons, at least one of $Ar_1$ and $Ar_2$ having a substituted or non-substituted styryl group as a substituent group, said triphenylene compound being in an electron transporting layer.

* * * * *